United States Patent
Kakimoto et al.

(10) Patent No.: US 8,518,834 B2
(45) Date of Patent: Aug. 27, 2013

(54) METHOD AND APPARATUS FOR FORMING OXIDE FILM ON CARBON FILM

(75) Inventors: Akinobu Kakimoto, Nirasaki (JP); Atsushi Endo, Nirasaki (JP); Kazumi Kubo, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/337,742

(22) Filed: Dec. 27, 2011

(65) Prior Publication Data

US 2012/0164844 A1 Jun. 28, 2012

(30) Foreign Application Priority Data

Dec. 27, 2010 (JP) ................. 2010-290405

(51) Int. Cl.
*H01L 21/31* (2006.01)
(52) U.S. Cl.
USPC 438/761; 257/77; 257/E23.074; 257/E21.128

(58) Field of Classification Search
USPC ............................................. 257/77
See application file for complete search history.

(56) References Cited

U.S. PATENT DOCUMENTS

| | | | |
|---|---|---|---|
| 2007/0122621 A1* | 5/2007 | Kreupl et al. | 428/408 |
| 2010/0233483 A1* | 9/2010 | Kawase et al. | 428/408 |
| 2010/0311251 A1* | 12/2010 | Okada et al. | 438/761 |

FOREIGN PATENT DOCUMENTS

| JP | 2008-266704 | * 11/2008 |
|---|---|---|
| JP | 2010-53397 A | 3/2010 |

* cited by examiner

*Primary Examiner* — Zandra Smith
*Assistant Examiner* — Pamela E Perkins
(74) *Attorney, Agent, or Firm* — Nath, Goldberg & Meyer; Jerald L. Meyer (57) ABSTRACT

A method for forming an oxide film on a carbon film includes the steps of forming a carbon film on an object to be processed; forming an object-to-be-oxidized layer on the carbon film; and forming an oxide film on the object-to-be-oxidized layer while oxidizing the object-to-be-oxidized layer.

6 Claims, 6 Drawing Sheets

METHOD AND APPARATUS FOR FORMING OXIDE FILM ON CARBON FILM

CROSS-REFERENCE TO RELATED APPLICATION

This application claims the benefit of Japanese Patent Application No. 2010-290405, filed on Dec. 27, 2010, in the Japan Patent Office, the disclosure of which is incorporated herein in their entirety by reference.

TECHNICAL FIELD

The present disclosure relates to a method and apparatus for forming an oxide film on a carbon film.

BACKGROUND

In manufacturing processes of semiconductor devices, there are some instances where a silicon oxide ($SiO_2$) film is formed on a carbon film and is then patterned.

For example, a $SiO_2$ film may be formed on an amorphous carbon film and is then patterned. The amorphous carbon film may be etched using the patterned $SiO_2$ film.

However, there is a problem that thickness of the carbon film is reduced when the $SiO_2$ film is directly formed on the carbon film. For example, if an atomic layer deposition (ALD) method using plasma with a process temperature at room temperature is used, the thickness of the carbon film is reduced by about 3 to 4 nm If the ALD method using plasma under the same conditions at a process temperature of 300 degrees C. is used, the thickness of the carbon film is reduced by about 5 to 7 nm. One of reasons for this is that carbon on a surface of the carbon film reacts with oxygen ($O_2$) or oxygen radicals ($O^*$) and is then volatilized as $CO_2$ or CO in an initial film forming phase of the $SiO_2$ film.

SUMMARY

According to the first embodiment of the present disclosure, there is provided a method for forming an oxide film on a carbon film. The method includes the steps of: forming a carbon film on an object to be processed; forming an object-to-be-oxidized layer on the carbon film; and forming an oxide film on the object-to-be-oxidized layer while oxidizing the object-to-be-oxidized layer.

According to the second embodiment of the present disclosure, there is provided an apparatus for forming an oxide film on a carbon film. The apparatus includes a processing chamber which accommodates an object to be processed with a carbon film formed thereon; a gas supplying mechanism which supplies gas used to form an object-to-be-oxidized layer and gas used to form an oxide film into the processing chamber; and a controller which controls the gas supplying mechanism to perform the film forming method according to the first embodiment.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION (Film Forming Method)

Figure 1A:
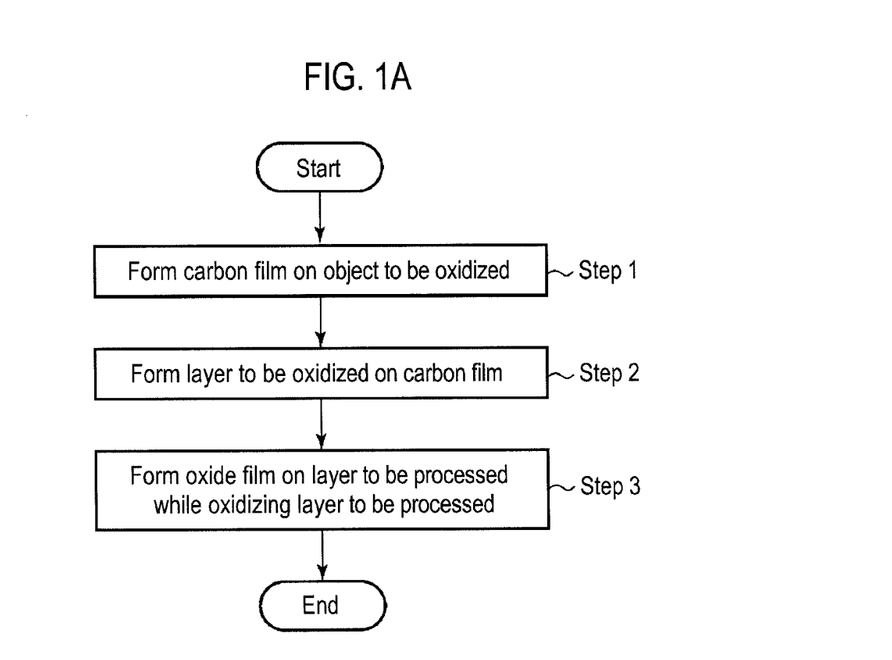
FIG. 1A is a flow chart showing an exemplary method for forming an oxide film on a carbon film according to one embodiment of the present disclosure.
Figure 1B:
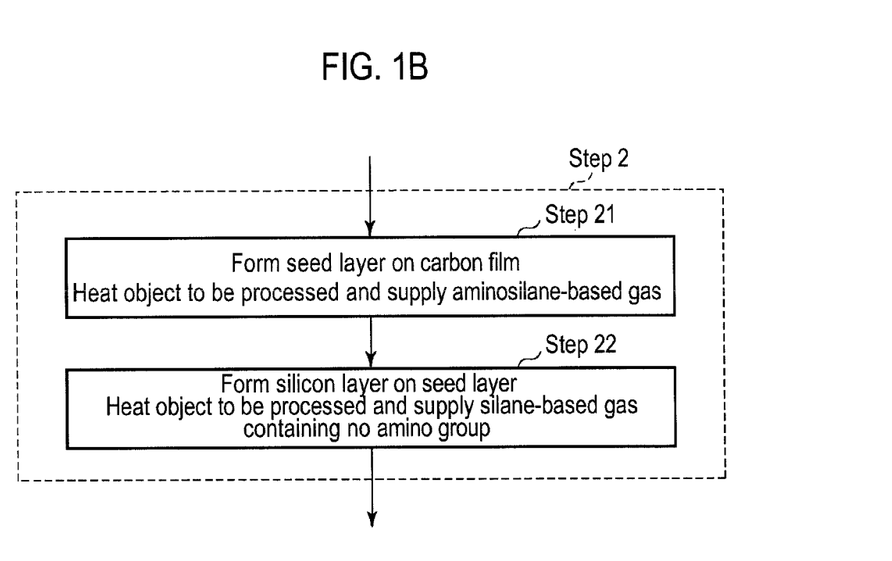
FIG. 1B is a flow chart showing an example of Step 2 in FIG. 1A.

FIG. 1A is a flow chart showing an exemplary method for forming an oxide film on a carbon film according to one embodiment of the present disclosure, FIG. 1B is a flow chart showing an example of Step 2 in FIG. 1A, and FIGS. 2A to 2E are schematic views showing a state of an object to be processed in sequences shown in FIGS. 1A and 1B.

First, as shown in Step 1 of FIG. 1A, a carbon film is formed on an object to be processed. In this example, a semiconductor wafer such as a silicon wafer W is used as the object to be processed. In this example, an amorphous carbon film 2 is formed on a silicon substrate 1 of the silicon wafer W (see FIG. 2A). The amorphous carbon film 2 may be formed using a plasma chemical vapor deposition (CVD) method, a plasma atomic layer deposition (ALD) method or a plasma molecular layer deposition (MLD) method, each of which has a process temperature of 200 degrees C. to 400 degrees C., or a thermal CVD method having a process temperature of 700 degrees C. to 900 degrees C. An example of film forming gas used may include carbon-containing gas such as ethylene ($C_2H_4$) gas or the like.

Next, as shown in Step 2 of FIG. 1A, an object-to-be-oxidized layer is formed on the amorphous carbon film 2. The object-to-be-oxidized layer may be made of any material as long as it can be oxidized. In this example, silicon is selected as material of which the object-to-be-oxidized layer is made and a silicon-containing layer is formed. In this example, the silicon-containing layer is formed in two steps as shown in FIG. 1B.

Figure 2A:
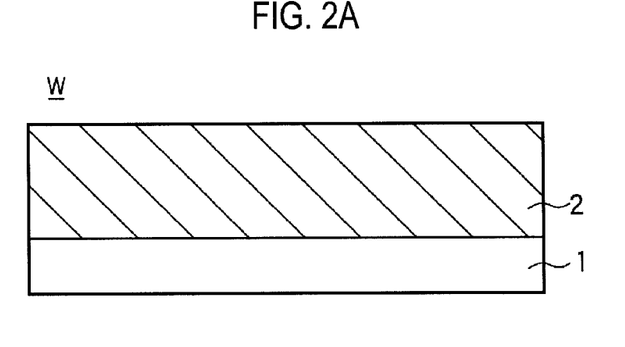
FIGS. 2A to 2E are schematic views showing a state of an object to be processed in the sequences shown in FIGS. 1A and 1B.
Figure 2B:
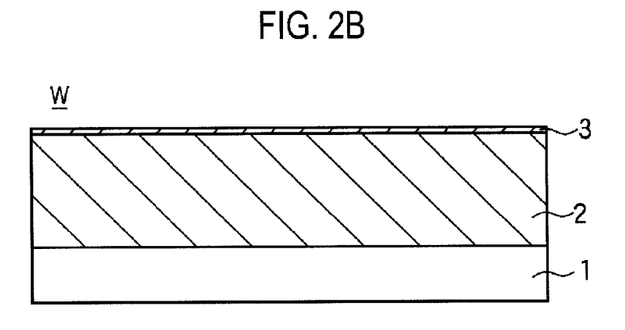

First, as shown in Step 21 of FIG. 1B, the silicon wafer W on which the amorphous carbon film 2 is formed is carried in a processing chamber of a film forming apparatus and a seed layer 3 is formed on the amorphous carbon film 2 (see FIG. 2B). In this example, the internal temperature of the processing chamber is increased to heat the silicon wafer W on which the amorphous carbon film 2 is formed, and then aminosilane-based gas is supplied onto a surface of the heated amorphous carbon film 2. As a result, the seed layer 3 is formed on the surface of the amorphous carbon film 2.

Examples of the aminosilane-based gas may include BAS (butylaminosilane), BTBAS (bis(tertiary)butylaminosilane), DMAS (dimetylaminosilane), BDMAS (bis(di)methyaminosilane), TDMAS (tri(di)methylaminosilane), DEAS (diethylaminosilane), BDEAS (bis(di)ethylaminosilane), DPAS (dipropylaminosilane), DIPAS (diisopropylaminosilane) and the like. In this example, DIPAS is used.

Step 21 may be performed under the process conditions of flow rate of DIPAS: 400 sccm, process time: 5 min, process temperature: 400 degrees C., and process pressure: 133 Pa (1 Torr). In the specification, the process in Step 21 is hereinafter called a "pre-flow."

Step 21 is a process which facilitates silicon material to be absorbed onto the amorphous carbon film 2. Although the specification states that the seed layer 3 is formed in Step 21, the seed layer 3 is hardly formed in actuality. In some embodiments, the seed layer 3 is as thick as a monatomic layer. Specifically, the thickness of the seed layer 3 is equal to or greater than 0.1 nm and equal to or less than 0.3 nm.

Figure 2C:
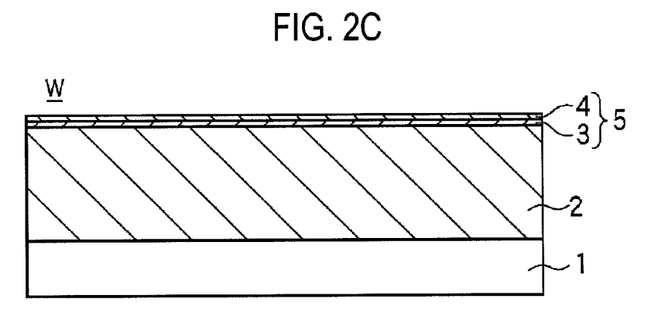
Figure 2D:
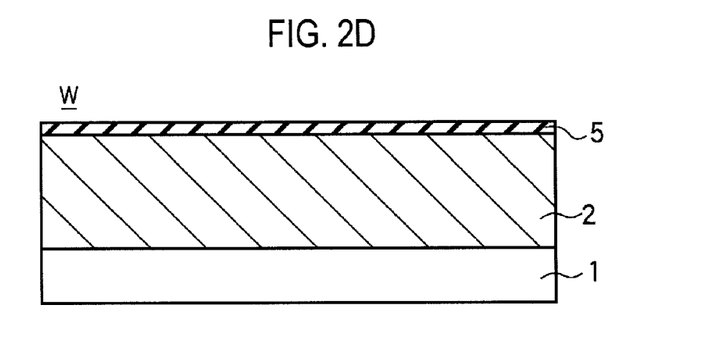

Next, as shown in Step 22 of FIG. 1B, a silicon layer 4 is formed on the seed layer 3 (see FIG. 2C). In this example, the silicon wafer W on which the seed layer 3 is formed is heated in the processing chamber and silane-based gas containing no amino group is supplied onto a surface of the seed layer 3. Accordingly, the silane-based gas containing no amino group on the surface of the seed layer 3 is thermally decomposed to form the silicon layer 4 on the seed layer 3. In this manner, in the example, an object-to-be-oxidized layer 5 includes the seed layer 3 having a thickness of equal to or greater than 0.1 nm and equal to or less than 0.3 nm, and the silicon layer 4 formed on the seed layer 3. The total film thickness may be, for example, equal to or greater than 3 nm and equal to or less than 5 nm.

An example of the silane-based gas containing no amino group may include gas containing at least one selected from a group consisting of $SiH_2$, $SiH_4$, $SiH_6$, $Si_2H_4$, $Si_2H_6$, silicon hydride formulated by $Si_mH_{2m+2}$ (m is a natural number of equal to or greater than 3) and silicon hydride formulated by $Si_nH_{2n}$, (n is a natural number of equal to or greater than 3). In this example, $SiH_4$ (monosilane) is used.

In this example, Step 22 may be performed under the process conditions of flow rate of monosilane: 800 sccm, process time: 3 min, process temperature: 530 degrees C., and process pressure: 133 Pa (1 Torr).

Under the above-mentioned process conditions of flow rate of monosilane, process temperature and process pressure, the thin silicon layer 4 having a thickness of about 3 nm is formed on the seed layer 3 for a process time (deposition time) of about 3 min, thereby forming the object-to-be-oxidized layer 5 including the seed layer 3 and the silicon layer 4.

Next, as shown in Step 3 in FIG. 1A, in the processing chamber, while oxidizing an object-to-be-oxidized layer 5 which includes the seed layer 3 and the silicon layer 4 in this example, an oxide film is formed on the object-to-be-oxidized layer 5. In this example, as the oxide film, a silicon oxide film 6 is formed on the object-to-be-oxidized layer 5 (see FIG. 2E).

Figure 2E:
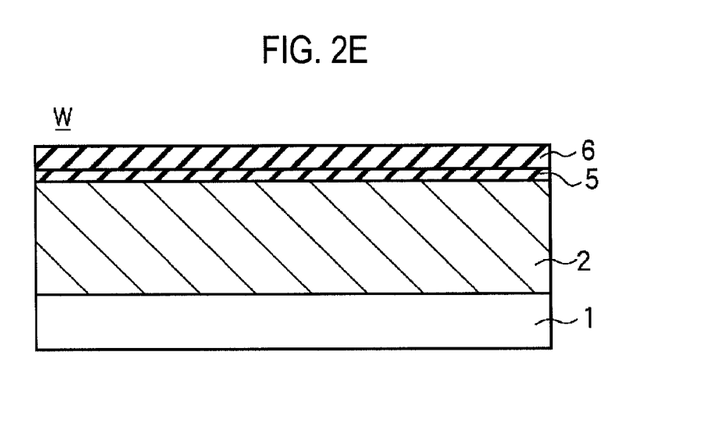

With the above-described method of forming the oxide film on the carbon film according to one embodiment, in this example, while oxidizing the object-to-be-oxidized layer 5 formed on the amorphous carbon film 2, an oxide film such as the silicon oxide film 6 in this example is formed on the amorphous carbon film 2. This may prevent the thickness of the amorphous carbon film 2 from being reduced even when the silicon oxide film 6 is formed on the amorphous carbon film 2.

One of reasons for reduction in the thickness of the amorphous carbon film 2 is that, in an initial film forming phase of the silicon oxide film 6, when an oxidizer such as oxygen ($O_2$) or oxygen radicals (O*) makes contact with a surface of the amorphous carbon film 2, carbon reacts with the oxygen or the oxygen radicals and is then volatilized as $CO_2$ or CO.

In order to overcome this problem, in one embodiment, the object-to-be-oxidized layer 5 is formed on the surface of the amorphous carbon film 2. This prevents oxygen or oxygen radicals from making direct contact with the surface of the amorphous carbon film 2 in the initial film forming phase of the silicon oxide film 6. This makes it difficult for carbon of the amorphous carbon film 2 to be volatilized, thereby preventing its thickness from being reduced.

In one embodiment, the oxidized object-to-be-oxidized layer 5 has the same composition as an oxide film to be formed later. In this example, the object-to-be-oxidized layer 5 is assumed to be a silicon-containing layer and the oxide film is assumed to be the silicon oxide film 6. The silicon-containing layer is oxidized into a silicon oxide layer which has the same composition as the silicon oxide film 6. This provides the advantage of using the same film forming gas for both of the object-to-be-oxidized layer 5 and the oxide film. In this example, aminosilane-based gas or silane-based gas containing no amino group may be used as the film forming gas for the oxide film. Of course, although an oxide other than silicon oxide may be sandwiched between the amorphous carbon film 2 and the silicon oxide film 6, the present embodiment may be applied to structures where no oxide is sandwiched therebetween.

The silicon oxide layer formed by oxidization of the silicon-containing object-to-be-oxidized layer 5 serves as an oxygen barrier layer through which oxygen can hardly pass. This can prevent an oxidizer from reaching the amorphous carbon film 2 through the object-to-be-oxidized layer 5 while forming the silicon oxide film 6. As a result, while the silicon oxide film 6 is being formed, it is possible to prevent the thickness of the amorphous carbon film 2 from being unintendedly reduced.

In one embodiment, the object-to-be-oxidized layer 5 is formed in two steps: forming the seed layer 3 and forming the silicon layer 4. This provides an advantage of providing a very small thickness (for example, equal to or greater than 3 nm and equal to or less than 5 nm) of the object-to-be-oxidized layer 5 formed on the amorphous carbon film 2.

The silicon layer is typically formed using silane-based gas containing no amino group. However, when the silicon layer 4 having the thickness of, for example, equal to or greater than 3 nm and equal to or less than 5 nm, is formed on the amorphous carbon film 2 using the silane-based gas containing no amino group, since silicon is in phase of grain growth, the silicon layer 4 has gaps between its grains. In such a silicon layer 4, the oxidizer makes direct contact with the surface of the amorphous carbon film 2 through the gaps in the initial film forming phase of the silicon oxide film 6. As a result, the amorphous carbon film 2 is oxidized to be volatilized. This may result in a weakened effect preventing the thickness of the amorphous carbon film from being reduced, as compared to the silicon layer 4 having no gap.

However, in one embodiment, before forming the silicon layer 4, the aminosilane-based gas is used to form the seed layer 3 on the amorphous carbon film 2 (pre-flow). The silicon layer 4 is formed on the seed layer 3. This may make it possible to shorten the time it takes until the silicon layer 4 begins to be formed (hereinafter referred to as "incubation time"). A shorter incubation time means that the silicon layer 4 can have a more uniform film with no gap even when it has a thickness of, for example, equal to or greater than 3 nm and equal to or less than 5 nm.

Figure 3:
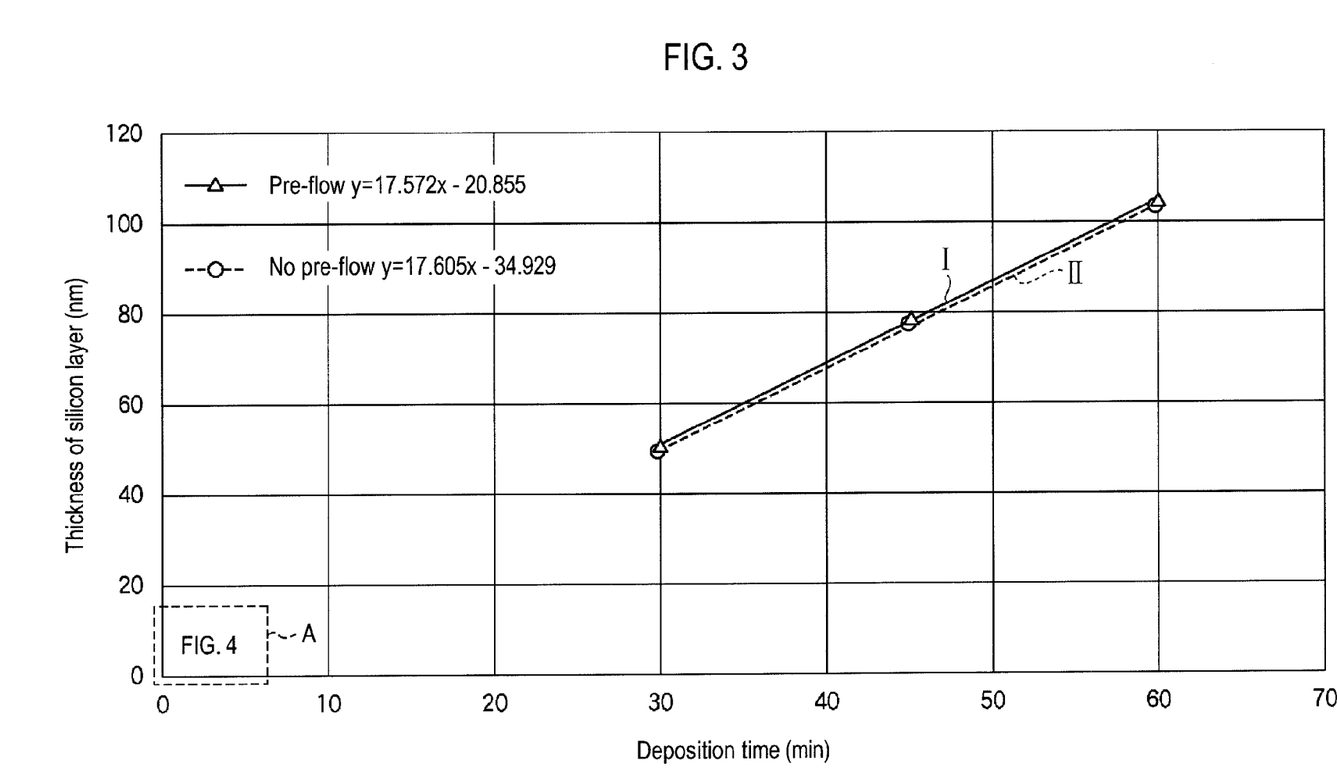
FIG. 3 is a view showing a relationship between deposition time and thickness of a silicon layer 4.

FIG. 3 shows a relationship between deposition time and thickness of the silicon layer 4. Although FIG. 3 shows the relationship when silicon oxide ($SiO_2$) is used as base, the relationship may exhibit the same tendency irrespective of whether the base is silicon oxide or amorphous carbon. This is because a pre-flow occurs, i.e., the seed layer 3 obtained by thermal decomposition of the aminosilane-based gas is formed on the base. The silicon layer 4 is thoroughly absorbed and formed on the seed layer 3.

In this example, the pre-flow used may be performed under the process conditions of flow rate of DIPAS: 500 sccm, process time: 5 min, process temperature: 400 degrees C., and process pressure: 53.2 Pa (0.4 Torr).

Likewise, in this example, the silicon layer 4 may be performed under the following process conditions of flow rate of monosilane: 500 sccm, deposition time: 30 min/45 min/60 min, process temperature: 500 degrees C., and process pressure: 53.2 Pa (0.4 Torr).

The thickness of the silicon layer 4 was measured at three points of time, i.e., when the deposition time is set to 30 min, 45 min and 60 min.

In FIG. 3, line I indicates a case where a pre-flow is present and line II indicates a case where no pre-flow is present. Lines I and II are straight lines produced by applying a linear approximation to three measured film thicknesses using the least square method and may be expressed by the following equation.

Line $I: y = 17.572x - 20.855$ [Equation 1]

Line $II: y = 17.605x - 34.929$ [Equation 1]

As shown in FIG. 3, the presence of pre-flow shows a noticeable tendency of increase in the thickness of the silicon layer 4 over the absence of pre-flow.

Figure 4:
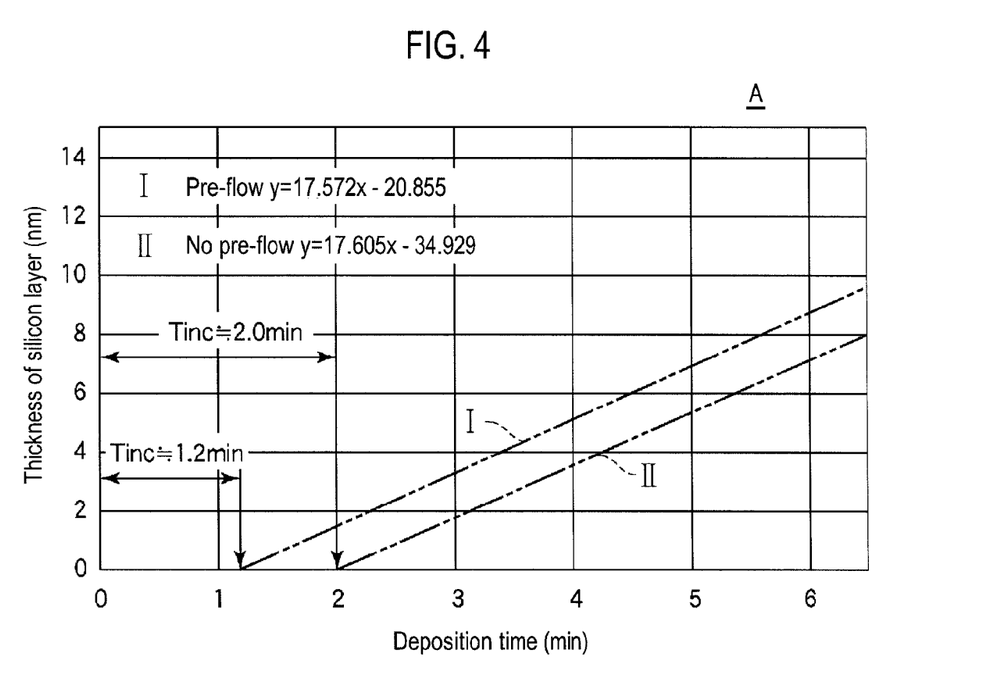
FIG. 4 is an enlarged view of a frame A indicated by a broken line in FIG. 3.

FIG. 4 shows intersections of lines I and II and the deposition time when y is set to zero, i.e., the thickness of the silicon layer 4 is assumed to be "0," in the above equations 1 and 2.

FIG. 4 is an enlarged view of a frame A indicated by a broken line in FIG. 3.

As shown in FIG. 4, in the presence of pre-flow, the silicon layer 4 begins to be deposited after about 1.2 min ($x \cong 1.189$) from the start of the process. In comparison, in the absence of pre-flow, the silicon layer 4 begins to be deposited after about 2.0 min ($x \cong 1.984$) from the start of the process.

As such, when the pre-flow of the aminosilane-based gas is performed for the base, the incubation time can be shortened from about 2.0 min to about 1.2 min. As a result, the silicon layer 4 having a very small thickness of, for example, 3 nm to 5 nm can be formed using monosilane.

With the above-described method of forming an oxide film on a carbon film according to one embodiment, it is possible to prevent the thickness of the carbon film from being reduced even when the oxide film is formed on the carbon film.

(Film Forming Apparatus)

Next, a film forming apparatus capable of performing the above-described method of forming an oxide film on a carbon film according to one embodiment will be described by way of example.

Figure 5:
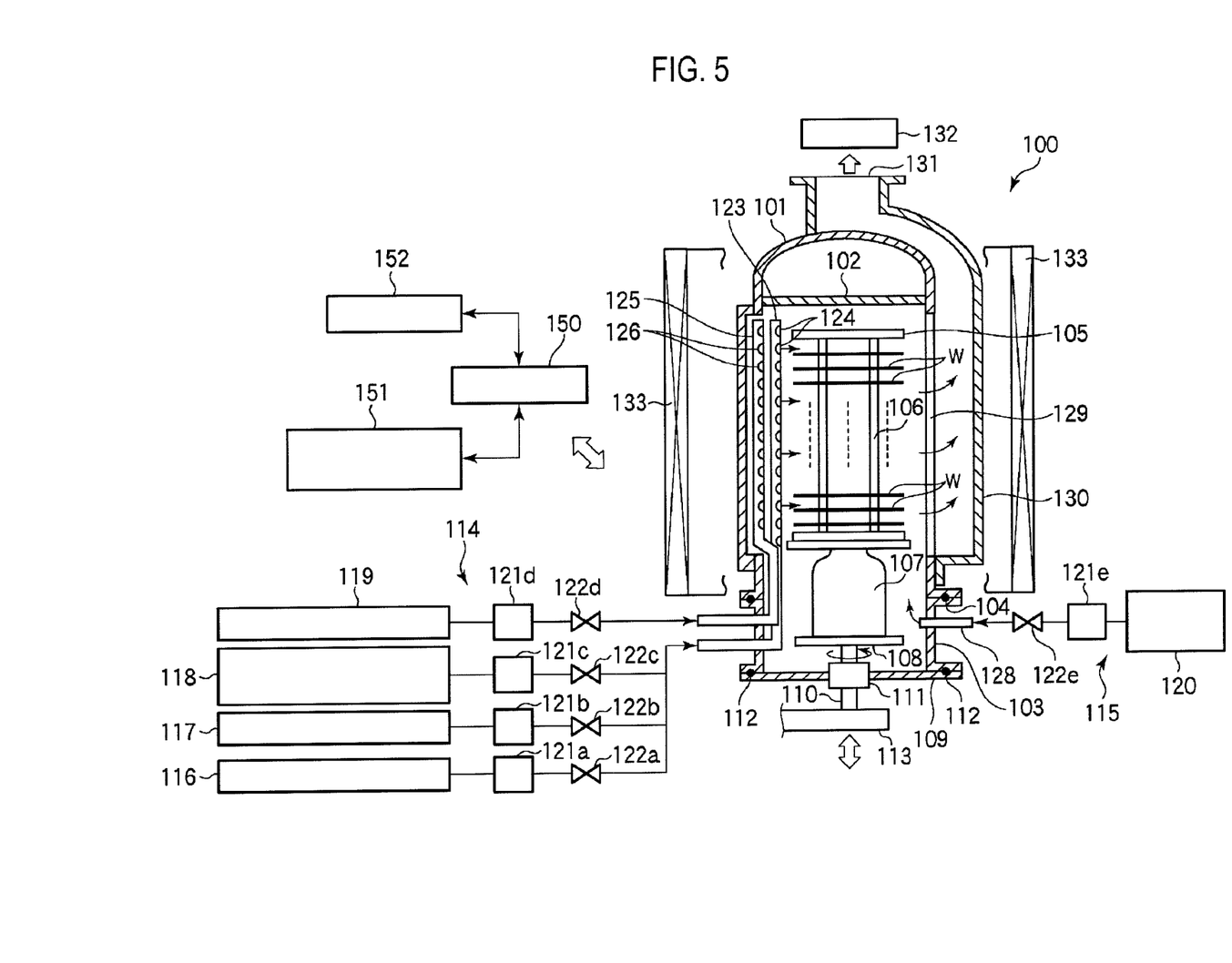
FIG. 5 is a schematic view showing an exemplary film forming apparatus for performing a method for forming an oxide film on a carbon film according to one embodiment.

FIG. 5 is a schematic view showing an exemplary film forming apparatus capable of performing the method for forming an oxide film on a carbon film according to one embodiment.

As shown in FIG. 5, a film forming apparatus 100 includes a cylindrical processing chamber 101 with its bottom opened and having a ceiling. The processing chamber 101 is entirely made of, for example, quartz. A ceiling plate 102 made of quartz is provided in the ceiling of the processing chamber 101. A cylindrical manifold 103 made of, for example, stainless steel, is connected to an opening of the bottom of the processing chamber 101 via a seal member 104 such as an O-ring.

The manifold 103 supports the bottom of the processing chamber 101. A wafer boat 105, which is made of quartz and can load a plurality of (for example, 50 to 100) semiconductor wafers (in this example, silicon wafers W) to be processed in multiple stages, is provided to be inserted in the processing chamber 101 from below the manifold 103. The wafer boat 105 includes a plurality of pillars 106 and the plurality of silicon wafers W is supported by grooves formed in the pillars 106.

The wafer boat 105 is loaded on a table 108 via a heat reserving tube 107. The table 108 is supported on a shaft 110 passing through a cover 109 which is made of, for example, stainless steel, and opens/closes an opening of the bottom of the manifold. For example, a magnetic fluid seal 111 is provided in a portion of the cover 109 through where the shaft passes. The magnetic fluid seal 111 rotatably supports the shaft 110 while airtightly sealing the shaft 110. A seal member 112 formed of, for example, an O-ring, is interposed between the periphery of the cover 109 and the bottom of the manifold 103 to thereby maintain sealability of the processing chamber 101. The shaft 110 is provided in a leading end of an arm 113 supported to an elevating mechanism (not shown) such as, for example, a boat elevator or the like, so that the wafer boat 105, the cover 109 and so on are elevated together to be inserted in or separated from the processing chamber 101.

The film forming apparatus 100 includes a process gas supplying mechanism 114 for supplying process gas into the processing chamber 101 and an inert gas supplying mechanism 115 for supplying inert gas in the processing chamber 101.

The process gas supplying mechanism 114 includes a carbon-containing gas source 116, an aminosilane-based gas source 117, a source 118 of silane-based gas containing no amino group, and an oxidizer-containing gas source 119. An example of the carbon-containing gas may include ethylene ($C_2H_4$) gas and an example of the oxidizer-containing gas may include oxygen ($O_2$) gas.

The inert gas supplying mechanism 115 includes an inert gas source 120. Inert gas is used for purge gas or the like. An example of the inert gas may include nitrogen ($N_2$) gas.

The carbon-containing gas source 116 is connected to a dispersion nozzle 123 via a flow rate regulator 121a and an opening/closing valve 122a. The dispersion nozzle 123 is formed of a quartz pipe, penetrates inward through a side wall of the manifold 103, and is bent upward to vertically extend. A plurality of gas discharging holes 124 is formed in a vertical portion of the dispersion nozzle 123 with predetermined intervals. The carbon-containing gas is substantially uniformly and horizontally discharged from the gas discharging holes 124 into the processing chamber 101.

The aminosilane-based gas source 117 is connected to the dispersion nozzle 123 via a flow rate regulator 121b and an opening/closing valve 122b. The aminosilane-based gas is also substantially uniformly and horizontally discharged from the gas discharging holes 124 into the processing chamber 101.

The source 118 of silane-based gas containing no amino group is also connected to the dispersion nozzle 123 via a flow rate regulator 121c and an opening/closing valve 122c. The silane-based gas containing no amino group is also substantially uniformly and horizontally discharged from the gas discharging holes 124 into the processing chamber 101.

The oxidizer-containing gas source 119 is connected to a dispersion nozzle 125 via a flow rate regulator 121d and an opening/closing valve 122d. The dispersion nozzle 125 is formed of a quartz pipe, penetrates inward through the side wall of the manifold 103, and is bent upward to vertically extend. A plurality of gas discharging holes 126 is formed in a vertical portion of the dispersion nozzle 125 with predetermined intervals. The oxidizer-containing gas is substantially uniformly and horizontally discharged from the gas discharging holes 126 into the processing chamber 101.

The inert gas source 120 is connected to a nozzle 128 via a flow rate regulator 121e and an opening/closing valve 122e. The nozzle 128 penetrates through a side wall of the manifold 103 and discharges the inert gas horizontally from its leading end into the processing chamber 101.

An exhaust port 129 for exhausting the interior of the processing chamber 101 is formed in the opposite side of the dispersion nozzles 123 and 125 in the processing chamber 101. The exhaust port 129 is formed to be elongated by vertically cutting out the side wall of the processing chamber 101. An exhaust port cover member 130 having its ⊐-shaped section to cover the exhaust port 129 is welded to a portion of the processing chamber 101 corresponding to the exhaust port 129. The exhaust port cover member 130 extends upward along the side wall of the processing chamber 101 and defines a gas outlet 131 above the processing chamber 101. An exhaust mechanism 132 including a vacuum pump or the like is connected to the gas outlet 131. The exhaust mechanism 132 exhausts the interior of the processing chamber so that the process gas used can be exhausted and the internal pressure of the processing chamber 101 can be set to a process pressure according to the process.

A tube-like heater 133 is provided in the outer circumference of the processing chamber 101. The heater 133 activates gas supplied into the processing chamber 101 while heating objects (in the example, the silicon wafers W) accommodated in the processing chamber 101.

Various components of the film forming apparatus 100 are controlled by a controller 150 implemented with, for example, a microprocessor (or a computer). The controller 150 is connected with a keyboard for allowing an operator to perform input manipulation such as command input and so on for management of the film forming apparatus 100, and a user interface 151 composed of a display or the like for visualizing and displaying running situations of the film forming apparatus 100.

The controller 150 is also connected with a storage unit 152 storing control programs for realizing various processes to be executed in the film forming apparatus 100 under control of the controller 150, and programs, i.e., recipes, for causing various components of the film forming apparatus 100 to perform their respective processes depending on their respective process conditions. For example, the recipes are stored in a storage medium of the storage unit 152. An example of the storage medium used may include a hard disk, a semiconductor memory, or a transferable (or portable) memory such as a CD-ROM, DVD, flash memory or the like. Alternatively, the recipes may be appropriately downloaded from other external apparatuses via their respective dedicated lines. If necessary, any recipe may be read from the storage unit 152 according to an instruction from the user interface 151 and then executed by the controller 150 so that a desired process can be performed in the film forming apparatus 100 under control of the controller 150.

In this example, Step 1, Step 21, Step 22 and Step 3 of the above-described method of forming an oxide film on a carbon film according to one embodiment are performed in order under the control of the controller 150. In Step 3, the oxide film can be formed by heating the silicon wafers W by means of the heater 133 while supplying silicon-containing gas, for example, silane-based gas containing no amino group, and oxidizer-containing gas from the source 118 of silane-based gas containing no amino group and the oxidizer-containing gas source 119, respectively, into the processing chamber 101. In this case, the silicon oxide film 6 is formed as an oxide film.

The silicon oxide film 6 may be formed using a so-called atomic layer deposition (ALD) or molecular layer deposition (MLD) method which forms a film while alternately supplying silicon-containing gas and oxidizer-containing gas or a so-called chemical vapor deposition (CVD) method which forms a film while simultaneously supplying silicon-containing gas and oxidizer-containing gas. An example of the ALD (or MLD) method may include a thermal ALD (or MLD) method or a plasma ALD (or MLD) method having a process temperature set to 25 degrees C. (the room temperature) to 400 degrees C. and an example of the CVD method may include a thermal CVD method or a plasma CVD method having a process temperature set to 400 degrees C. to 800 degrees C.

The above-described method of forming an oxide film on a carbon film according to one embodiment may be performed by the film forming apparatus 100 as shown in FIG. 5.

Although the present disclosure has been described by way of one embodiment, the present disclosure is not limited thereto but may be modified in various ways. The disclosed embodiment of the present disclosure is not the only embodiment.

For example, the oxide film may be formed using a plasma CVD method. In this case, for example, a plasma generating mechanism to make the oxidizer-containing gas into plasma is placed in the processing chamber 101.

In addition, ozone ($O_3$) gas may be used for the oxidizer, in which case an ozonizer to generate ozone gas may be provided in the oxidizer-containing gas source 119.

It has been illustrated in the above-described embodiment that the film forming apparatus 100 includes the carbon-containing gas source 116 and forms the amorphous carbon film 2 on the silicon-containing object-to-be-oxidized layer 5 and silicon oxide film 6 in situ. However, the film forming apparatus may include at least the aminosilane-based gas source 117, the source 118 of silane-based gas containing no amino group and the oxidizer-containing gas source 119. Such a film forming apparatus may also form the silicon-containing object-to-be-oxidized layer 5 and silicon oxide film 6 in situ on the amorphous carbon film 2 formed by a different film forming apparatus, thereby preventing the amorphous carbon film 2 from being reduced.

In addition, although it has been illustrated in the above-described embodiment that the spirit of the present disclosure is applied to the batch type film forming apparatus which forms films in a batch for a plurality of loaded silicon wafers W, the present disclosure is not limited thereto but may be applied to a single wafer type film forming apparatus which forms a film on every wafer.

In addition, the object to be processed is not limited to the semiconductor wafer but the present disclosure may be applied to other substrates including an LCD glass substrate and so on.

Aside from this, a variety of modifications is possible without departing from the spirit thereof.

According to the present disclosure in some embodiments, it is possible to provide a method for forming an oxide film on a carbon film, which is capable of preventing the thickness of the carbon film from being reduced even when an oxide film is formed on the carbon film, and a film forming apparatus which is capable of performing the film forming method.

While certain embodiments have been described, these embodiments have been presented by way of example only, and are not intended to limit the scope of the disclosures.

Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for forming an oxide film on a carbon film, the method comprising:
    forming a carbon film on an object to be processed;
    forming an object-to-be-oxidized layer on the carbon film; and
    forming an oxide film on the object-to-be-oxidized layer while oxidizing the object-to-be-oxidized layer,
    wherein the object-to-be-oxidized layer is a silicon-containing layer, and
    wherein the forming the object-to-be-oxidized layer on the carbon film includes:
        heating the object to be processed and forming a seed layer on the carbon film by supplying aminosilane-based gas onto a surface of the carbon film; and
        heating the object to be processed on which the seed layer is formed and forming the silicon-containing layer on the seed layer by supplying silane-based gas containing no amino group onto a surface of the seed layer.

2. The method of claim 1 wherein the aminosilane-based gas comprises at least one selected from a group consisting of BAS (butylaminosilane), BTBAS (bis(tertiary)butylaminosilane), DMAS (dimetylaminosilane), BDMAS (bis(di)methyaminosilane), TDMAS (tri(di)methylaminosilane), DEAS (diethylaminosilane), BDEAS (bis(di)ethylaminosilane), DPAS (dipropylaminosilane) and DIPAS (diisopropylaminosilane), and the silane-based gas containing no amino group comprises at least one selected from a group consisting of $SiH_2$, $SiH_4$, $SiH_6$, $Si_2H_4$, $Si_2H_6$, silicon hydride formulated by $Si_mH_{2m+2}$ (where m is a natural number equal to or greater than 3) and silicon hydride formulated by $Si_nH_{2n}$ (where n is a natural number equal to or greater than 3).

3. The method of claim 2, wherein the silicon hydride formulated by $Si_mH_{2m+2}$ (where m is a natural number equal to or greater than 3) is at least one selected from a group consisting of trisilane ($Si_3H_8$), tetrasilane ($Si_4H_{10}$), pentasilane ($Si_5H_{12}$), hexasilane ($Si_6H_{14}$) and heptasilane ($Si_7H_{16}$), and the silicon hydride formulated by $Si_nH_{2n}$ (where n is a natural number equal to or greater than 3) is at least one selected from a group consisting of cyclotrisilane ($Si_3H_6$), cyclotetrasilane ($Si_4H_8$), cyclopentasilane ($Si_5H_{10}$), cyclohexasilane ($Si_6H_{12}$) and cycloheptasilane ($Si_7H_{14}$).

4. The method of claim 1, wherein the thickness of the silicon-containing layer is equal to or greater than 3 nm and equal to or less than 5 nm.

5. The method of claim 1, wherein the oxide film is a silicon oxide film.

6. The method of claim 1, wherein the object to be processed is a semiconductor wafer and the method is used for a process of manufacturing a semiconductor device.

* * * * *